United States Patent
Kawamura (10) Patent No.: US 10,510,879 B2
(45) Date of Patent: Dec. 17, 2019

(54) SEMICONDUCTOR DEVICE (71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Keiko Kawamura, Kawasaki (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/106,360

(22) Filed: Aug. 21, 2018

(65) Prior Publication Data

US 2019/0296147 A1 Sep. 26, 2019

(30) Foreign Application Priority Data

Mar. 22, 2018 (JP) ................................. 2018-054798

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0634* (2013.01); *H01L 29/0696* (2013.01);
(Continued)

(58) Field of Classification Search
CPC ................ H01L 29/41766; H01L 29/66727
See application file for complete search history.

(56) References Cited

U.S. PATENT DOCUMENTS 6,803,626 B2 * 10/2004 Sapp .................... H01L 29/0634
257/329
7,635,622 B2 12/2009 Yamaguchi et al.
(Continued)

FOREIGN PATENT DOCUMENTS

JP 2007-317683 12/2007
JP 5011881 8/2012
(Continued)

*Primary Examiner* — Eric A. Ward
(74) *Attorney, Agent, or Firm* — Oblon, McClelland, Maier & Neustadt, L.L.P.

(57) ABSTRACT

A semiconductor device includes first to third semiconductor layers stacked, and control electrodes provided in trenches extending in a stacking direction. The device further includes an insulating region and a fourth semiconductor layer. The insulating region is provided between first and second control electrodes adjacent to each other. The fourth semiconductor layer is provided between the insulating region and the first and second control electrodes, and between the insulating region and the first semiconductor layer. A first insulating film is provided between the first control electrode and the fourth semiconductor layer, and contacts the first control electrode and the fourth semiconductor layer. A second insulating film is provided between the second control electrode and the fourth semiconductor layer, and contacts the second control electrode and the fourth semiconductor layer. The insulating region has an end positioned at a level lower than a level of ends of the control electrodes.

20 Claims, 10 Drawing Sheets

(51) Int. Cl.
*H01L 29/417* (2006.01)
*H01L 29/10* (2006.01)
*H01L 29/08* (2006.01)

(52) U.S. Cl.
CPC ...... *H01L 29/0865* (2013.01); *H01L 29/1095* (2013.01); *H01L 29/41766* (2013.01); *H01L 29/7811* (2013.01)

(56) References Cited

U.S. PATENT DOCUMENTS

| | | | |
|---|---|---|---|
| 7,755,138 B2 | 7/2010 | Saito et al. | |
| 8,319,314 B2 * | 11/2012 | Ogura | H01L 29/0834 257/564 |
| 8,829,608 B2 | 9/2014 | Saito et al. | |
| 8,936,985 B2 * | 1/2015 | Challa | H01L 21/3065 438/270 |
| 2016/0118492 A1 | 4/2016 | Asada et al. | |

FOREIGN PATENT DOCUMENTS

| | | |
|---|---|---|
| JP | 5612256 | 10/2014 |
| JP | 5740108 | 6/2015 |
| JP | 5833277 | 12/2015 |

\* cited by examiner

SEMICONDUCTOR DEVICE

CROSS-REFERENCE TO RELATED APPLICATIONS

This application is based upon and claims the benefit of priority from Japanese Patent Application No. 2018-054798, filed on Mar. 22, 2018; the entire contents of which are incorporated herein by reference.

FIELD

Embodiments relate to a semiconductor device.

BACKGROUND

It is desirable for a power control semiconductor device such as a power MOS transistor or the like to have a high breakdown voltage and a low ON-resistance. For example, in a vertical MOS transistor having a trench gate structure, it is desirable to maintain the breakdown voltage by relaxing the electric field concentration at the periphery of the trench gate. Also, it is desirable to reduce the ON-resistance by widening the current path between adjacent trench gates.

BRIEF DESCRIPTION OF THE DRAWINGS

FIGS. 2A to 6C are schematic cross-sectional views showing manufacturing processes of the semiconductor device according to the embodiment;

DETAILED DESCRIPTION

According to one embodiment, a semiconductor device includes a first semiconductor layer of a first conductivity type; a second semiconductor layer of a second conductivity type provided on the first semiconductor layer; a third semiconductor layer of the first conductivity type provided on the second semiconductor layer; and a plurality of control electrodes. The plurality of control electrodes are provided respectively in a plurality of trenches. The plurality of trenches have depths into the first semiconductor layer from a top surface of the third semiconductor layer. The device further includes an insulating region, a fourth semiconductor layer of the second conductivity type, a first insulating film, a second insulating film and a first electrode connected to the third semiconductor layer and the fourth semiconductor layer. The insulating region is provided between a first control electrode and a second control electrode of the plurality of control electrodes. The first control electrode and the second control electrode are adjacent to each other in a first direction along an interface between the first semiconductor layer and the second semiconductor layer. The insulating region extends in a second direction from the third semiconductor layer toward the first semiconductor layer. The fourth semiconductor layer is provided between the insulating region and the first semiconductor layer, between the insulating region and the first control electrode, and between the insulating region and the second control electrode. The first insulating film is provided between the first control electrode and the fourth semiconductor layer, and the fourth semiconductor layer is in contact with a whole portion of the first insulating film positioned between the first control electrode and the fourth semiconductor layer. The second insulating film is provided between the second control electrode and the fourth semiconductor layer, and the fourth semiconductor layer is in contact with a whole portion of the second insulating film positioned between the second control electrode and the fourth semiconductor layer. The plurality of control electrodes extend in the second direction, and have ends positioned in the first semiconductor layer. The insulating region has an end positioned in the first semiconductor layer. The end of the insulating region is positioned at a level in the second direction lower than the level in the second direction of the ends of the plurality of control electrodes.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1A:
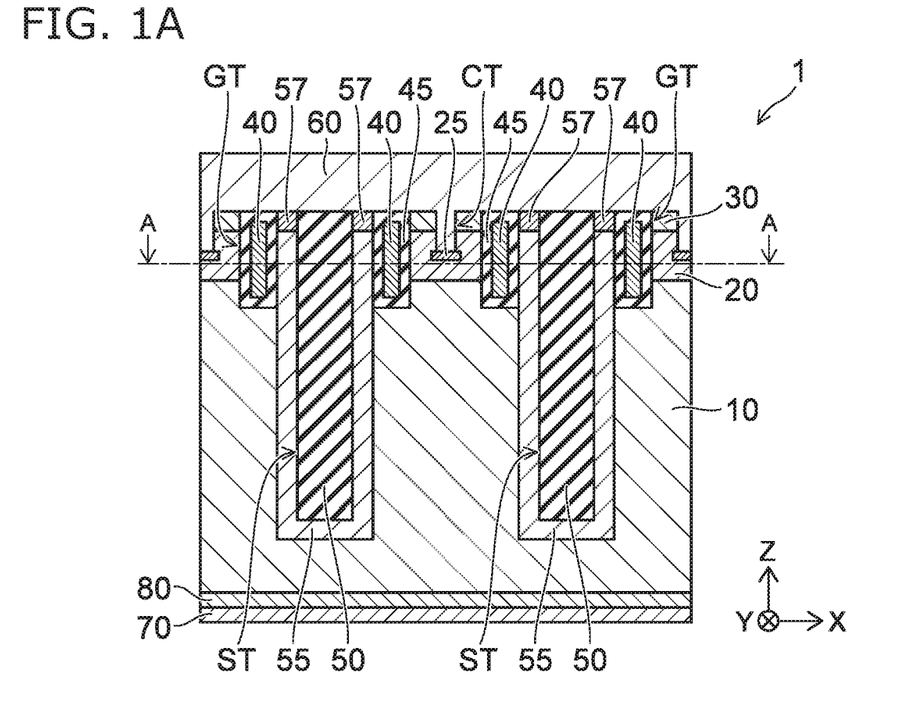
FIGS. 1A and 1B are schematic cross-sectional views showing a semiconductor device according to an embodiment.
Figure 1B:
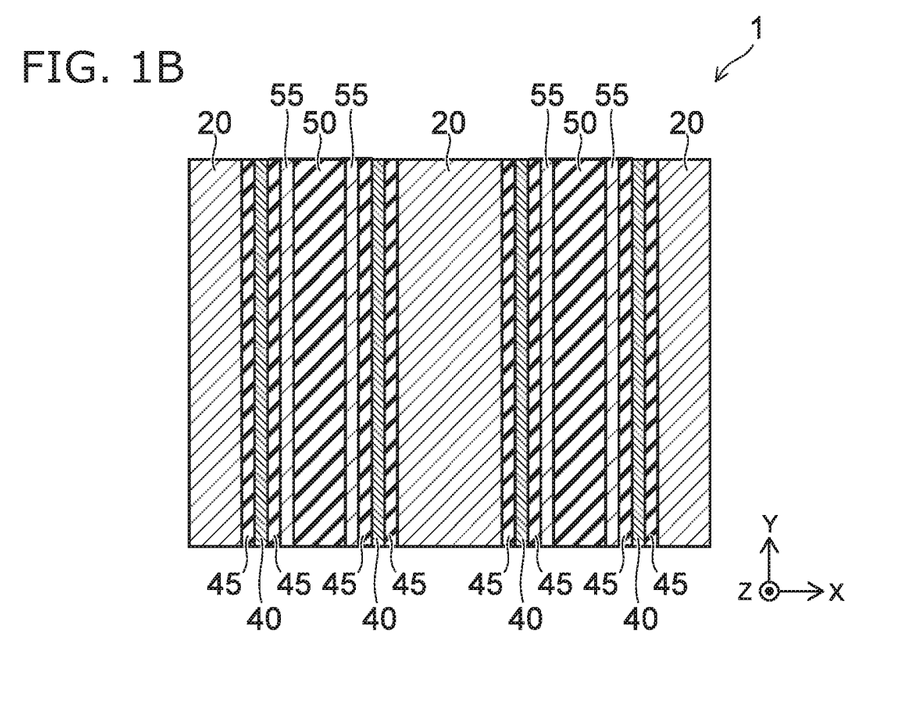

FIGS. 1A and 1B are schematic cross-sectional views showing a semiconductor device 1 according to an embodiment. FIG. 1A is a schematic view showing a vertical cross section of the semiconductor device 1. FIG. 1B is a schematic view showing a horizontal cross section along line A-A shown in FIG. 1A. The semiconductor device 1 is, for example, a trench-gate type power NMOS transistor. For example, the semiconductor device 1 is formed using a silicon wafer.

As shown in FIG. 1A, the semiconductor device 1 includes an N-type drift layer 10, a P-type body layer 20, and an N-type source layer 30. The P-type body layer 20 is provided on the N-type drift layer 10; and the N-type source layer 30 is provided on the P-type body layer 20.

The semiconductor device 1 further includes a gate electrode 40, an insulating region 50, and a P-type semiconductor layer 55. The gate electrode 40 is provided in a gate trench GT. For example, the insulating region 50 is provided in a trench ST. The P-type semiconductor layer 55 is provided between the insulating region 50 and the N-type drift layer 10. Also, the P-type semiconductor layer 55 includes a portion positioned between the insulating region 50 and the gate trench GT.

The gate electrode 40 is provided in the gate trench GT with a gate insulating film 45 interposed. For example, the gate trench GT is provided to divide the P-type body layer 20 and the N-type source layer 30, and has a depth from the top surface of the N-type source layer 30 to the N-type drift layer 10.

The gate electrode 40 has an top end positioned at or higher than a level of the interface between the P-type body layer 20 and the N-type source layer 30 in a direction (hereinbelow, a Z-direction) from the N-type drift layer 10 toward the N-type source layer 30. Also, the gate electrode 40 has a bottom end positioned at a lower level than the level of the interface between the N-type drift layer 10 and the P-type body layer 20.

The gate insulating film 45 is provided in the gate trench GT to electrically insulate the gate electrode 40 from the N-type drift layer 10, the P-type body layer 20, the N-type source layer 30, and the P-type semiconductor layer 55.

The insulating region 50 includes, for example, an insulating body such as silicon oxide, etc., filled into the trench ST. For example, the trench ST is provided between the gate trenches GT adjacent to each other in a direction (hereinbelow, an X-direction) along the interface between the N-type drift layer 10 and the P-type body layer 20. The trench ST has a depth from the upper surface of the N-type source layer 30 to the interior of the N-type drift layer 10. The trench ST is provided to be deeper than the gate trench GT. The P-type semiconductor layer 55 is provided to contact the insulating body filled into the trench ST and the gate insulating film 45 provided in the gate trench GT. The P-type semiconductor layer 55 is in contact with a whole portion of the gate insulating film 45 positioned between the gate electrode 40 and the P-type semiconductor layer 55. Thus, the N-type drift layer 10, the P-type body layer 20 and the N-type source layer 30 is not provided between the gate electrode 40 and the P-type semiconductor layer 55.

As shown in FIG. 1B, the gate electrode 40 and the insulating region 50 are provided to extend in a Y-direction. The P-type semiconductor layer 55 extends in the Y-direction between the gate electrode 40 and the insulating region 50. The arrangement of the gate electrode 40 and the insulating region 50 shown in FIG. 1B is an example; and the embodiment is not limited thereto.

The semiconductor device 1 further includes a source electrode 60, a drain electrode 70, and an N-type drain layer 80.

The source electrode 60 is provided to contact the N-type source layer 30. The source electrode 60 also contacts a P-type contact region 25. For example, the source electrode 60 includes a portion extending in a trench dividing the N-type source layer 30, and contacts the P-type contact region 25 provided in the P-type body layer 20. Also, the P-type contact region 25 may be provided in the surface layer of the P-type body layer 20 positioned between the N-type source layers 30, and may be provided to contact the source electrode 60.

The source electrode 60 is provided to cover the gate electrode 40 and the insulating region 50; and the gate insulating film 45 includes a portion that is positioned between the gate electrode 40 and the source electrode 60 and electrically insulates the gate electrode 40 from the source electrode 60. Further, the source electrode 60 is provided to contact the P-type semiconductor layer 55. The P-type semiconductor layer 55 includes a P-type contact region 57 that contacts the source electrode 60.

The N-type drift layer 10 is positioned between the source electrode 60 and the drain electrode 70. The N-type drain layer 80 is positioned between the N-type drift layer 10 and the drain electrode 70. The N-type drain layer 80 contacts the N-type drift layer 10; and the drain electrode 70 contacts the N-type drain layer 80. The N-type drain layer 80 includes a higher concentration of an N-type impurity than an N-type impurity concentration of the N-type drift layer 10.

In the semiconductor device 1, due to the P-type semiconductor layer 55 extending into the N-type drift layer 10, the electric field concentration is relaxed in the OFF state; and a higher breakdown voltage can be achieved. For example, the P-type semiconductor layer 55 is provided so that the total amount of the P-type impurity of the P-type semiconductor layer 55 is substantially the same as the total amount of the N-type impurity included in the N-type drift layer 10.

For example, an amount of the P-type impurity and an amount of the N-type impurity are balanced in the P-type semiconductor layer 55 and the N-type drift layer 10 at a level in the Z-direction where the P-type semiconductor layer 55 contacts a portion of the N-type drift layer 10 positioned between the insulating region 50 and another insulating region 50 adjacent thereto.

Thus, a charge balance between the N-type drift layer 10 and the P-type semiconductor layer 55 is achieved; and the electric field distribution can be made uniform in the N-type drift layer 10. Thereby, the electric field concentration is suppressed in the N-type drift layer 10; and a higher breakdown voltage is achieved in the semiconductor device 1. Also, it is possible to enlarge the avalanche breakdown voltage by enhancing transport of the holes generated in the N-type drift layer 10 into the source electrode 60 through the P-type semiconductor layer 55.

A method for manufacturing the semiconductor device 1 will now be described with reference to FIG. 2A to FIG. 6C. FIG. 2A to FIG. 6C are schematic cross-sectional views sequentially showing manufacturing processes of the semiconductor device 1.

Figure 2A:
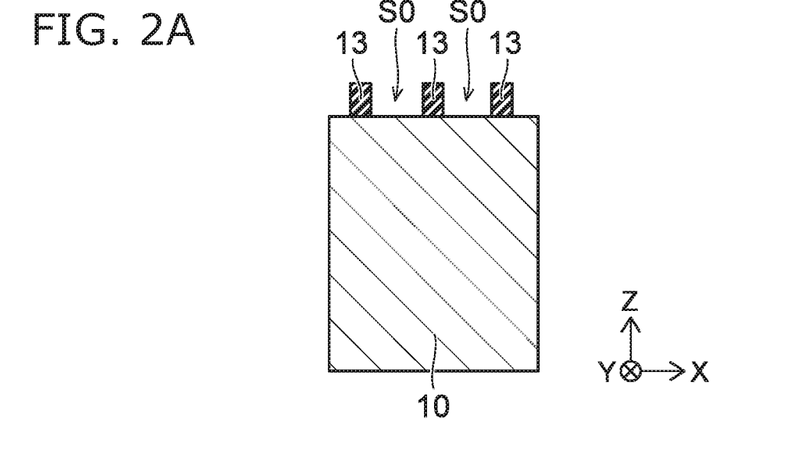

As shown in FIG. 2A, a mask layer 13 is formed on the top surface of the N-type drift layer 10. The N-type drift layer 10 is, for example, an epitaxial silicon layer formed on an N-type silicon substrate.

The mask layer 13 is, for example, a silicon nitride film that is formed into a line-and-space pattern extending in the Y-direction. A space S0 is formed between the lines of the mask layer 13 mutually-adjacent in the X-direction. Also, the mask layer 13 may be provided in a mesh configuration having multiple openings.

Figure 2B:
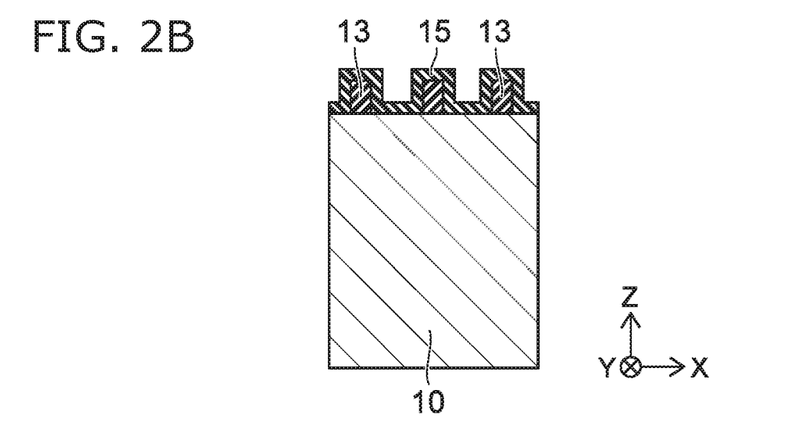

As shown in FIG. 2B, an insulating film 15 that covers the N-type drift layer 10 and the mask layer 13 is formed. The insulating film 15 is, for example, a silicon oxide film formed by CVD (Chemical Vapor Deposition).

Figure 2C:
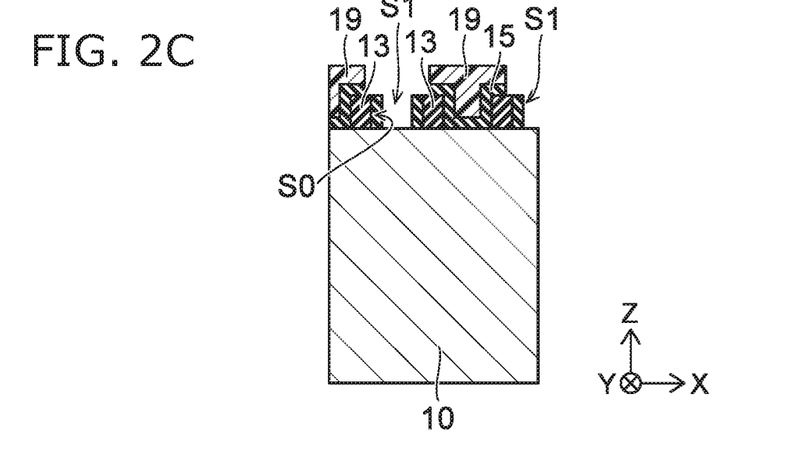

As shown in FIG. 2C, openings S1 are formed by selectively removing the insulating film 15 using a resist mask 19. For example, the openings S1 are disposed every other space S0 between the lines of the mask layer 13.

For example, the insulating film 15 is selectively removed using anisotropic RIE (Reactive Ion Etching). Thereby, the portions of the insulating film 15 that are formed on the side surface of the mask layer 13 remain; and other portions that are formed on the surface of the N-type drift layer 10 are selectively removed. A width in the X-direction of the opening S1 is formed to be narrower than the width in the X-direction of the space S0.

Figure 3A:
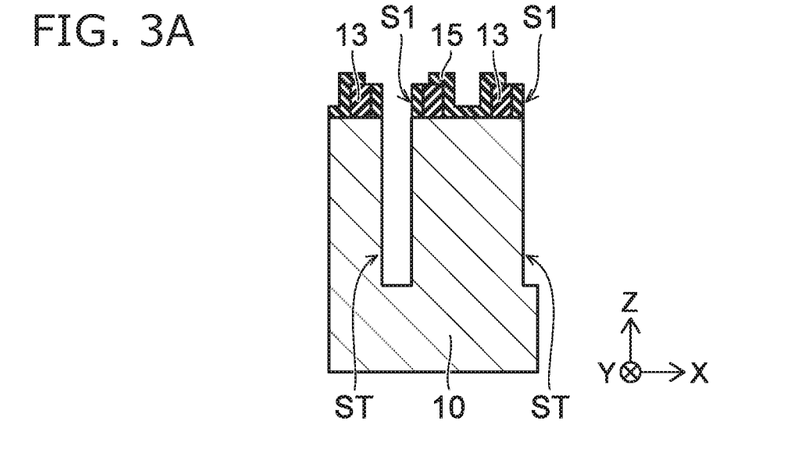

As shown in FIG. 3A, the trench ST is formed by selectively removing the N-type drift layer 10 using the insulating film 15 as a mask. For example, the N-type drift layer 10 is selectively removed using anisotropic RIE.

Figure 3B:
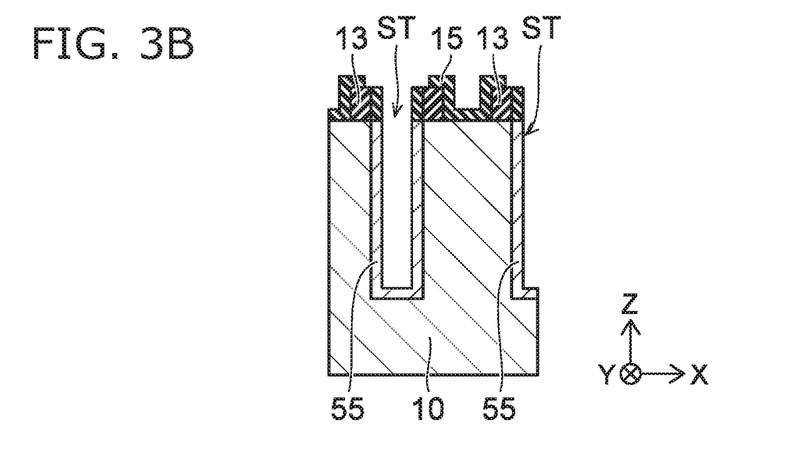

As shown in FIG. 3B, the P-type semiconductor layer 55 is formed along the inner surface of the trench ST. For example, the P-type semiconductor layer 55 is formed by introducing P-type impurities into the N-type drift layer 10 by using ion implantation or plasma doping.

Figure 3C:
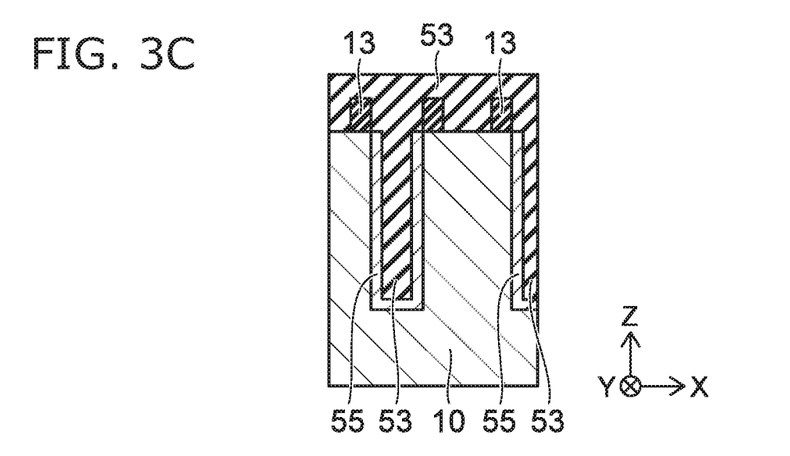

As shown in FIG. 3C, the trench ST is filled by forming an insulating film 53. The insulating film 53 is, for example, a silicon oxide film formed using CVD; and the insulating film 15 is joined into one body with the insulating film 53.

Figure 4A:
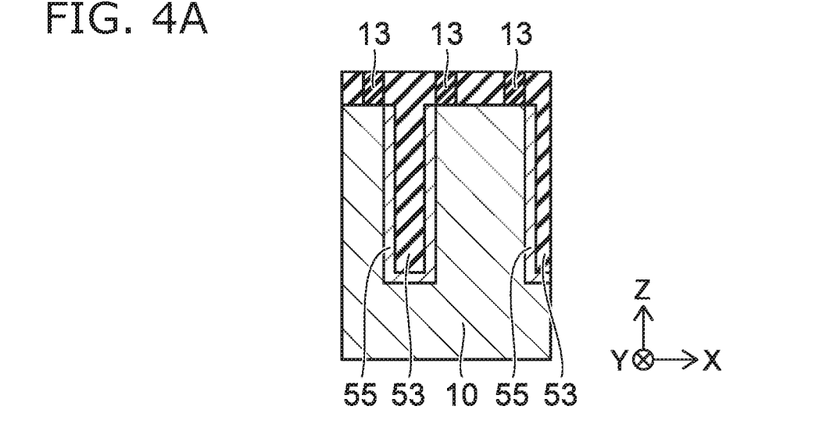

As shown in FIG. 4A, the insulating film 53 is made thinner at the portion positioned above the N-type drift layer 10 so that the mask layer 13 is exposed. For example, the thickness of the insulating film 53 is reduced by CMP (Chemical Mechanical Polishing) or etch-back.

Figure 4B:
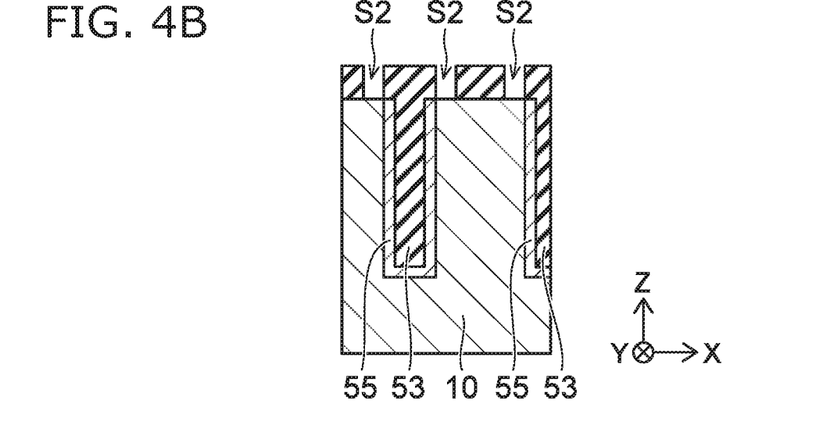

As shown in FIG. 4B, an opening S2 is formed by selectively removing the mask layer 13. The surface of the N-type drift layer 10 is exposed at the bottom surface of the opening S2.

Figure 4C:
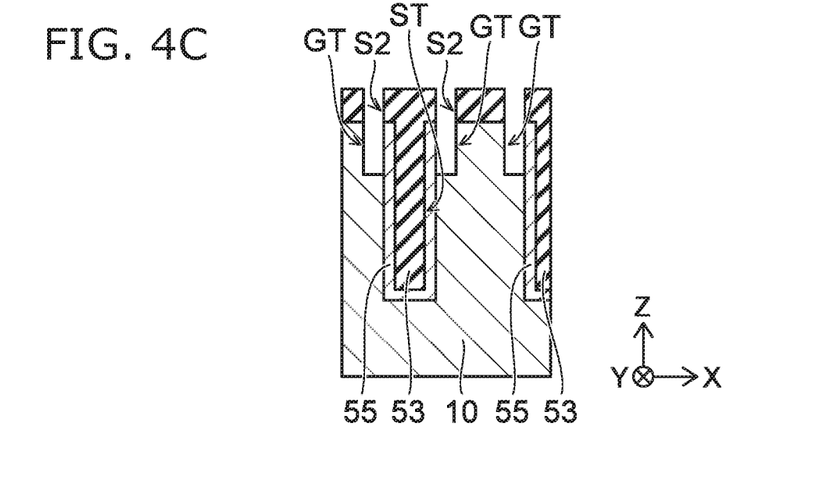

As shown in FIG. 4C, the gate trench GT is formed by selectively removing the N-type drift layer 10 via the opening S2. For example, the gate trench GT is formed to be shallower than the trench ST by using RIE. The N-type drift layer 10 and the P-type semiconductor layer 55 are exposed at the inner surface of the gate trench GT.

Figure 5A:
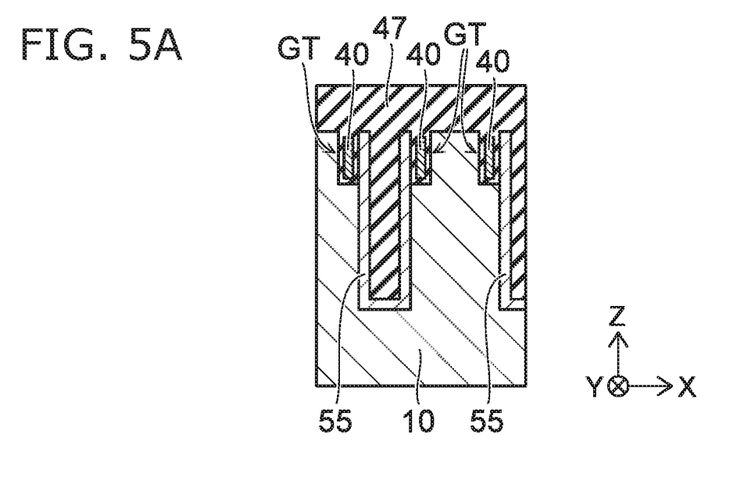

As shown in FIG. 5A, the gate electrode 40 is formed in the gate trench GT. For example, a gate insulating film is formed by performing thermal oxidation of the N-type drift layer 10 and the P-type semiconductor layer 55 exposed at the inner surface of the gate trench GT; subsequently, a conductive body such as polysilicon or the like is formed to fill the gate trench GT. Then, the conductive body of the polysilicon or the like is etched back so that the portion of the conductive body remains in the gate trench GT.

An insulating film 47 is formed to fill the openings S2. The insulating film 47 is, for example, a silicon oxide film formed using CVD; and the insulating film 53 and the gate insulating film are joined into one body with the insulating film 47.

Figure 5B:
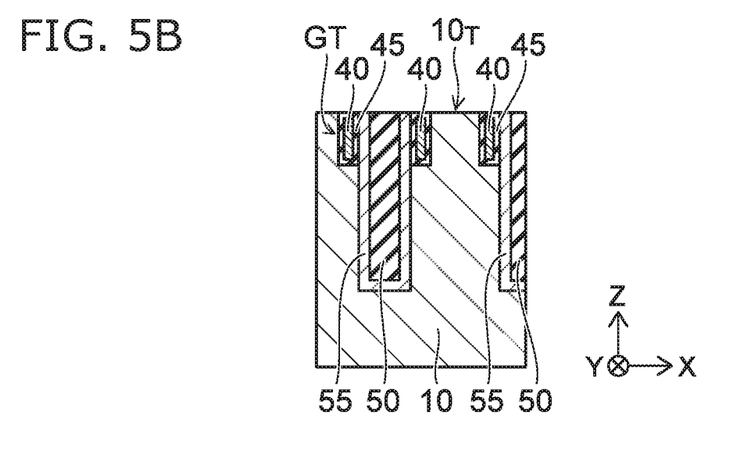

As shown in FIG. 5B, the N-type drift layer 10 and the P-type semiconductor layer 55 are exposed by removing the portion of the insulating film 47 that is positioned above the N-type drift layer 10. For example, the insulating film 47 is removed using CMP. The gate electrode 40 and the gate insulating film 45 (i.e., the portion of the insulating film 47 filled into the gate trench GT) are embedded in the gate trench GT. The insulating region 50 is formed in the trench ST by embedding a portion of the insulating film 47 therein.

Figure 5C:
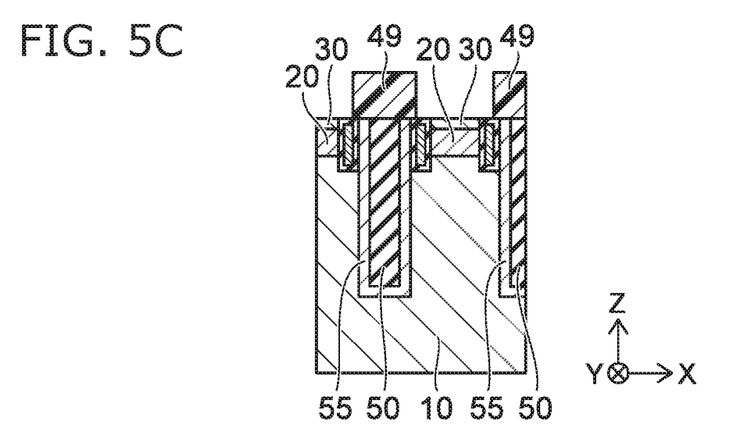

As shown in FIG. 5C, the P-type body layer 20 and the N-type source layer 30 are formed on the N-type drift layer 10. For example, the P-type body layer 20 and the N-type source layer 30 are formed by introducing a P-type impurity and an N-type impurity into the N-type drift layer 10 by using ion implantation. At this time, a mask 49 is disposed so that the N-type impurity is not introduced to the P-type semiconductor layer 55.

The P-type body layer 20 is formed so that the interface between the N-type drift layer 10 and the P-type body layer 20 is positioned at a higher level than the level of the bottom end of the gate electrode 40. The N-type source layer 30 is formed so that the interface between the P-type body layer 20 and the N-type source layer 30 is positioned at a lower level than a level of the top end of the gate electrode 40.

Figure 6A:
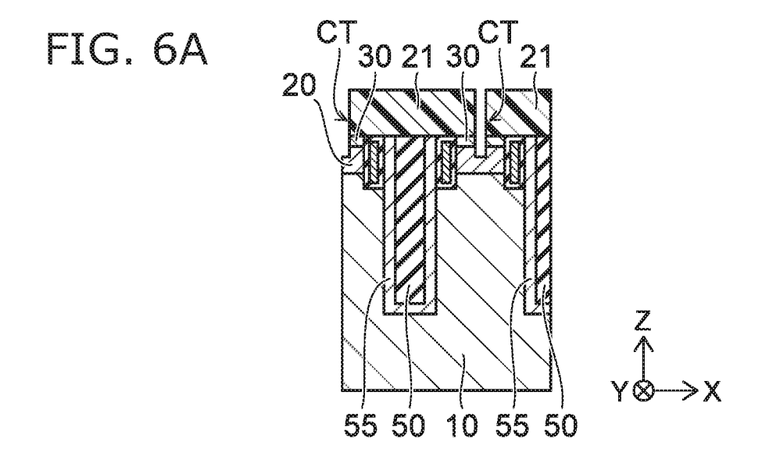

As shown in FIG. 6A, a trench CT that has a depth from the top surface of the N-type source layer 30 to the P-type body layer 20 is formed using a resist mask 21. For example, the trench CT is formed using anisotropic RIE.

Figure 6B:
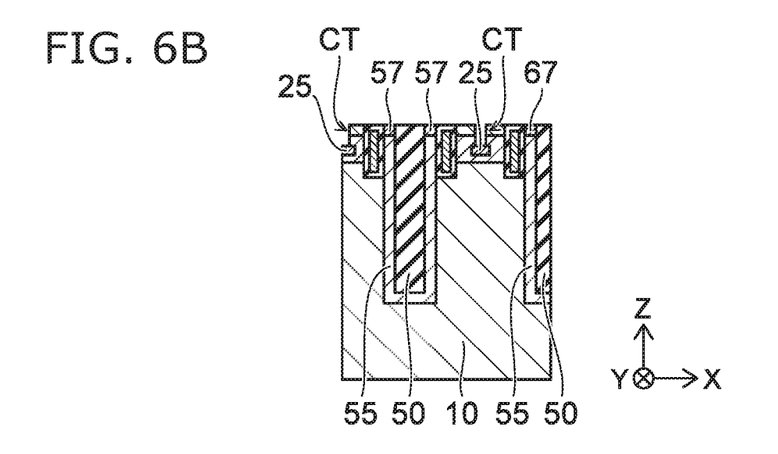

As shown in FIG. 6B, the P-type contact region 25 of the P-type body layer 20 and the P-type contact region 57 of the P-type semiconductor layer 55 are formed. For example, the P-type contact regions 25 and 57 are formed by ion implantation of a P-type impurity. The P-type contact region 25 is formed by ion implantation of the P-type impurity into the P-type body layer 20 via the trench CT. The dose of the P-type impurity is set not to cause P-conversion of the N-type source layer 30.

Figure 6C:
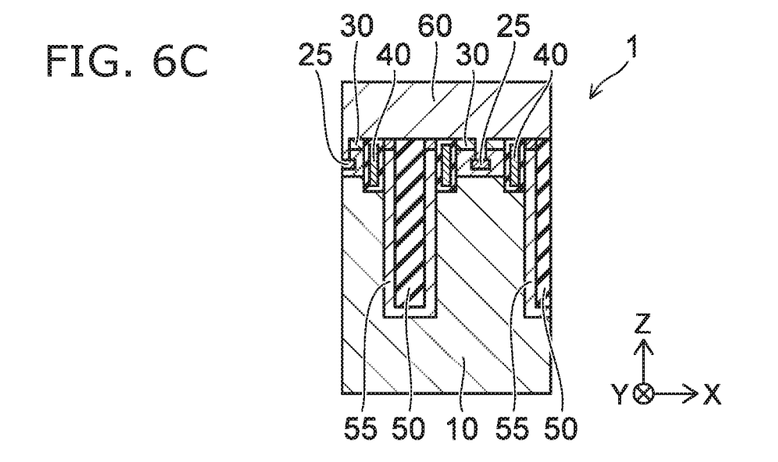

As shown in FIG. 6C, the source electrode 60 is formed to contact the N-type source layer 30 and the P-type semiconductor layer 55. The source electrode 60 includes a portion that extends inside the trench CT and contacts the P-type contact region 25. The source electrode 60 contacts the P-type semiconductor layer 55 via the P-type contact region 57.

Then, the thickness of the N-type silicon substrate (not-illustrated) is reduced to be the N-type drain layer 80. Further, the drain electrode 70 is formed; and the semiconductor device 1 is completed (referring to FIGS. 1A and 1B).

In the manufacturing method recited above, the position of the gate electrode 40 is set by the mask layer 13 provided on the N-type drift layer 10 (referring to FIG. 2A); and the positions and the sizes of the insulating region 50 and the P-type semiconductor layer 55 formed subsequently also are determined by the mask layer 13. Accordingly, photolithography processes are omitted in the manufacturing processes of the semiconductor device 1; and the downscaling of the element structure becomes easy.

By making the insulating film 15 remain on the side surface of the mask layer 13 (referring to FIG. 2C), it is possible to form the P-type semiconductor layer 55 between the insulating region 50 and the gate trench GT; and the connection between the source electrode 60 and the P-type semiconductor layer 55 also is easy.

Figure 10:
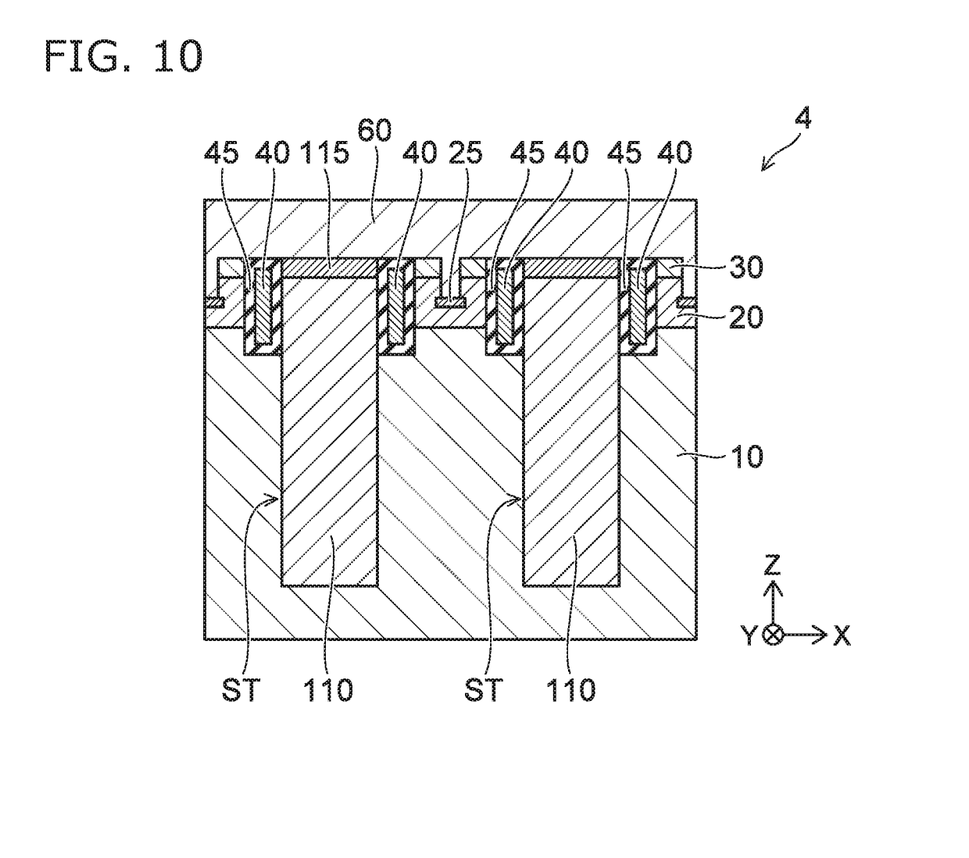
FIG. 10 is a schematic cross-sectional view showing a semiconductor device according to a comparable example.

For example, in a semiconductor device 4 shown in FIG. 10 as well, it is possible to suppress the electric field concentration and increase the breakdown voltage in the OFF state. In the semiconductor device 4, a P-type semiconductor layer 110 is embedded in the trench ST. The P-type semiconductor layer 110 also is connected to the source electrode 60 via a P-type contact region 115. The P-type semiconductor layer 110 is, for example, monocrystalline silicon layer formed by epitaxial growth.

In the semiconductor device 4, the P-type semiconductor layer 110 is provided to achieve charge balance with the N-type drift layer 10. Thereby, the electric field concentration in the N-type drift layer 10 can be suppressed. However, in the case where the width in the X-direction of the trench ST is narrow and the trench ST is formed to be deeper in the Z-direction, that is, in the case where a trench ST having a high aspect ratio is formed, it is difficult to fill the P-type semiconductor layer 110. Therefore, the trench ST is formed to have a width in the X-direction such that epitaxial growth is available.

In contrast, according to the embodiment, it is sufficient for the trench ST to have enough space for performing the ion implantation or the plasma doping; and thus, it is possible to reduce the width in the X-direction. Thereby, the downscaling of the element structure in the X-Y plane is possible. Also, it is possible to enlarge the width in the X-direction of the P-type body layer 20 between the gate trenches GT, and to reduce the ON-resistance.

Although an NMOS transistor is described as an example in the embodiments recited above, the embodiments are not limited thereto. For example, the transistor may be a PMOS transistor in which the conductivity types of the semiconductor layers are reversed. Also, the transistor may be an IGBT (a Gate Insulated Bipolar Transistor), which has a structure including a P-type collector layer instead of the N-type drain layer 80. Similar is achieved in the examples shown below.

Figure 7A:
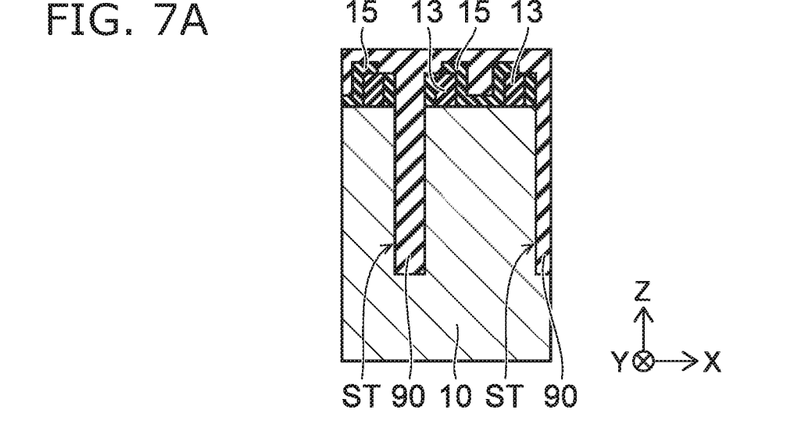
FIGS. 7A to 7C are schematic cross-sectional views showing another manufacturing process of the semiconductor device according to the embodiment.
Figure 7B:
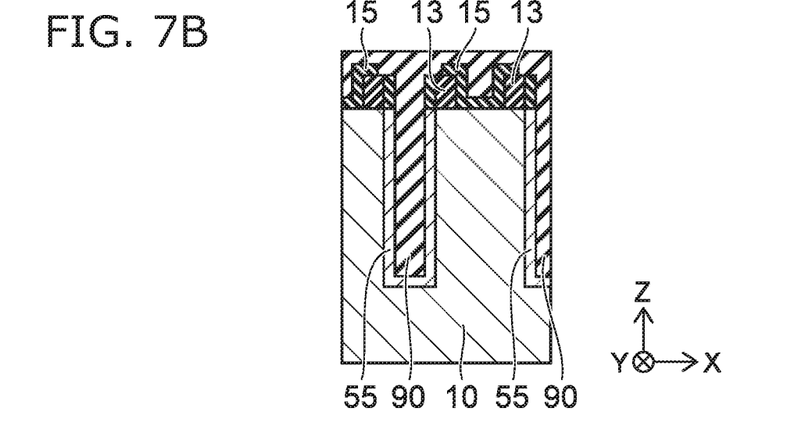
Figure 7C:
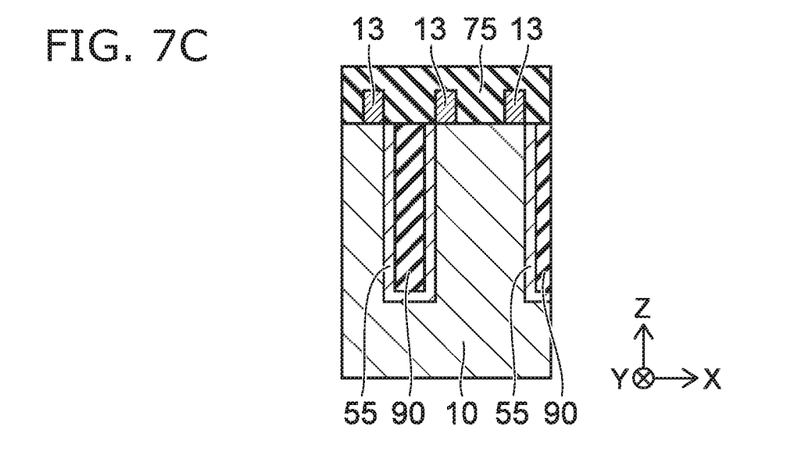

FIGS. 7A to 7C are schematic cross-sectional views showing another method for manufacturing the semiconductor device 1 according to the embodiment. FIGS. 7A to 7C are cross-sectional views showing manufacturing processes following to FIG. 3A and replacing the manufacturing processes shown in FIGS. 3B and 3C.

As shown in FIG. 7A, the trench ST is filled by forming an insulating film 90. The insulating film 90 is, for example, a BSG (Boron Silicate Glass) film formed using CVD and includes a P-type impurity of boron (B).

As shown in FIG. 7B, the P-type semiconductor layer 55 is formed along the insulating film 90 embedded in the trench ST. For example, the P-type semiconductor layer 55 is formed by the P-type impurity diffused from the insulating film 90 into the N-type drift layer 10.

As shown in FIG. 7C, the insulating film 90 is removed such that the portion filling the trench ST remains therein; and then, an insulating film 75 is formed. The insulating film 75 is, for example, a silicon oxide film formed using CVD. Thereby, the insulating region 50 is formed in the trench ST.

Thereafter, the semiconductor device 1 is completed using the manufacturing processes shown in FIG. 4A to FIG. 6C. In the example, the insulating film 90 includes a P-type impurity. In the case where a PMOS transistor is formed, for example, a PSG (Phosphor Silicate Glass) film is used as the insulating film 90.

Figure 8:
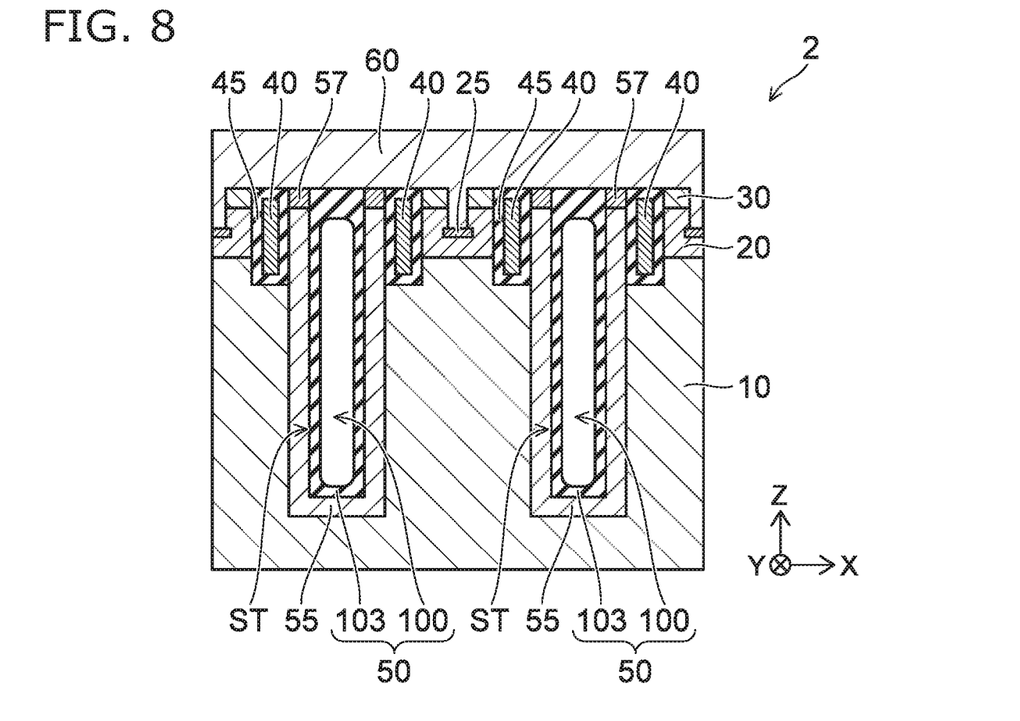
FIG. 8 is a schematic cross-sectional view showing a semiconductor device according to a variation of the embodiment.

FIG. 8 is a schematic cross-sectional view showing a semiconductor device 2 according to a variation of the embodiment. As shown in FIG. 8, the semiconductor device 2 has a void 100 in the trench ST. In other words, the semiconductor device 2 has the void 100 in the insulating region 50.

For example, after forming the P-type semiconductor layer 55 (referring to FIG. 3B), an insulating film 103 is formed to cover the interior of the trench ST. The insulating film 103 is, for example, a silicon oxide film. For example, in the case where the width in the X-direction of the trench ST is narrower, the opening is plugged before the interior is filled with the insulating film 103. As a result, the void 100 is formed in the trench ST.

In the semiconductor device 2 as well, the electric field concentration is relaxed by the P-type semiconductor layer 55 formed in the N-type drift layer 10; and the breakdown voltage can be increased in the OFF state. Further, by forming the void 100 in the trench ST, for example, the stress is suppressed comparing with the case where the trench ST is filled with a silicon oxide film, etc.; and it is possible to suppress the warp of the semiconductor substrate.

Figure 9:
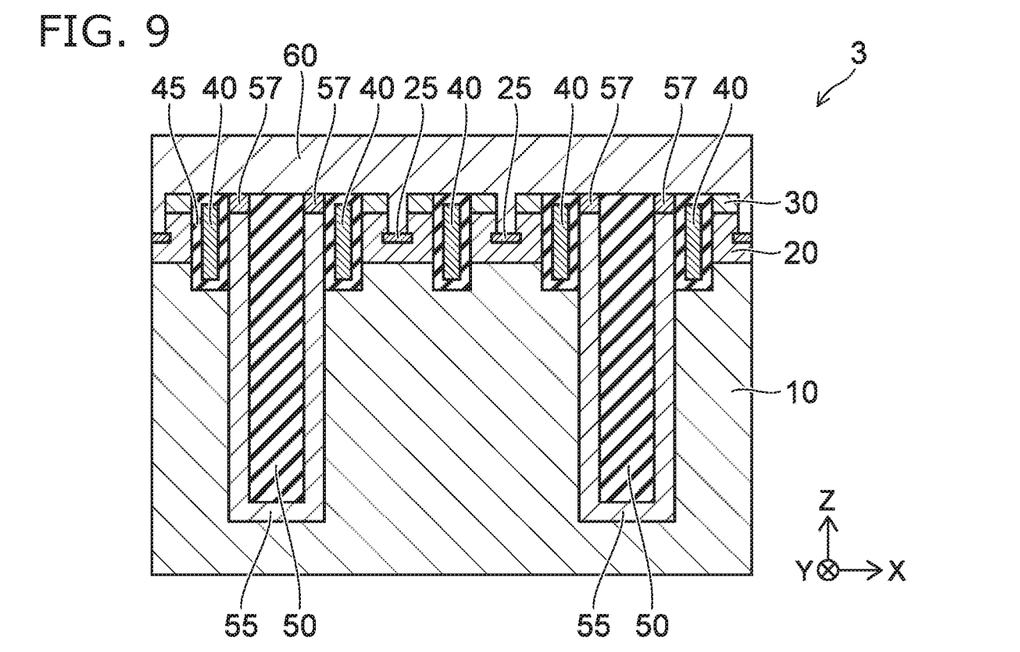
FIG. 9 is a schematic cross-sectional view showing a semiconductor device according to another variation of the embodiment.

FIG. 9 is a schematic cross-sectional view showing a semiconductor device 3 according to another variation of the embodiment. As shown in FIG. 9, the semiconductor device 3 includes three gate electrodes 40 disposed between the adjacent insulating regions 50. The semiconductor device 3 is formed by disposing the openings S1 every two spaces S0 between the lines of the mask layer 13 in the process shown in FIG. 2C.

In the semiconductor device 3 as well, a higher breakdown voltage can be realized by the charge balance between the N-type drift layer 10 and the P-type semiconductor layer 55. In the semiconductor device 3, by enlarging the space between the insulating regions 50, the path of the ON-current is widened; and the ON-resistance can be reduced. The increase of the number of channels formed between the P-type body layer 20 and the gate electrode 40 also contributes to the reduction of the ON-resistance. It is also possible to set the number of the gate electrodes 40 provided between the insulating regions 50 to be 4 or more.

For example, the multiple gate electrodes 40 shown in FIGS. 1A and 1B, FIG. 8, and FIG. 9 are electrically connected to each other at not-illustrated portions. Also, the multiple gate electrodes 40 may be an electrode having one body linked at not-illustrated portions.

Figure 11:
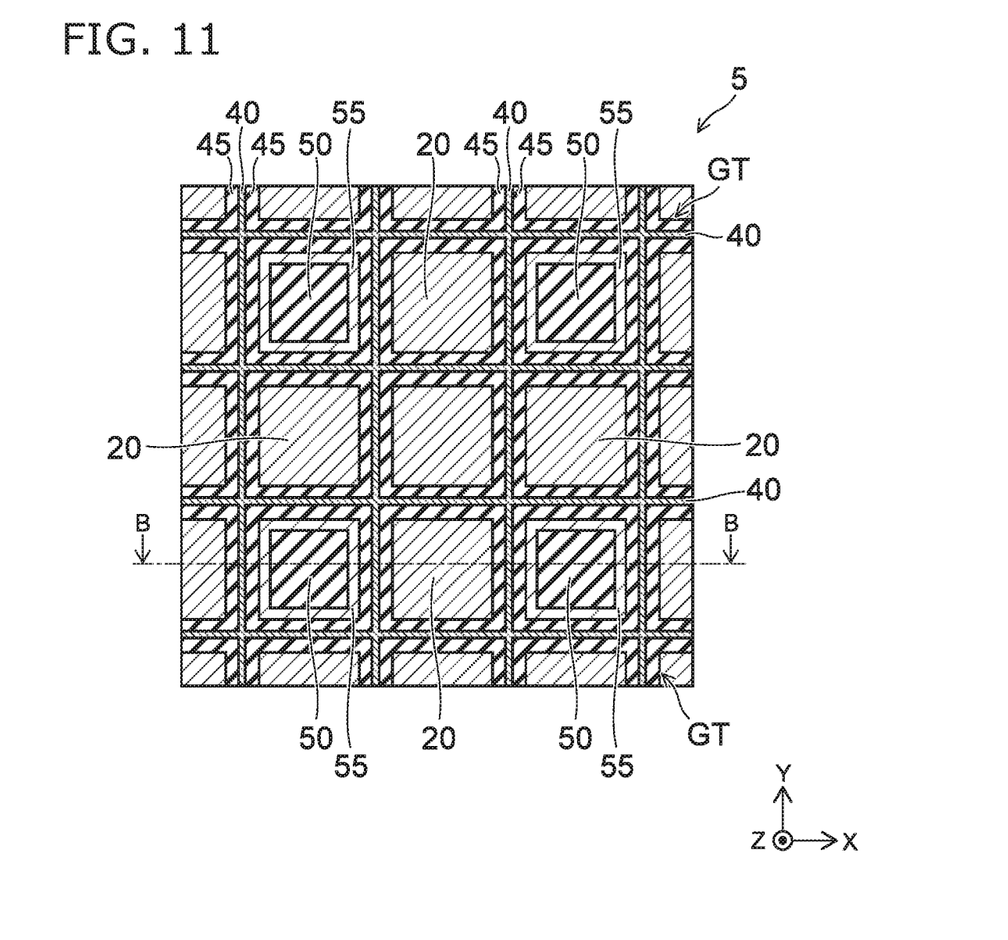
FIG. 11 is a schematic cross-sectional view showing a semiconductor device according to yet another variation of the embodiment.

FIG. 11 is a schematic cross-sectional view showing a semiconductor device 5 according to yet another variation of the embodiment. FIG. 11 is a horizontal cross-sectional view corresponding to a cross section along line A-A shown in FIG. 1A. The cross-sectional structure along line B-B shown in FIG. 11 is the same as the structure shown in FIG. 1A.

In the semiconductor device 5, the gate trench GT is provided in a lattice configuration when viewed from the Z-direction, and the gate electrode 40 is formed as one body in the gate trench GT. The insulating region 50 is provided in a portion surrounded with the gate electrode 40. The P-type semiconductor layer 55 that is between the insulating region 50 and the gate electrode 40 is provided to surround the insulating region 50.

For example, the multiple insulating regions 50 are disposed to be separated from each other in the X-direction and the Y-direction. The arrangement of the insulating regions 50 shown in FIG. 11 is an example and is not limited thereto.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first semiconductor layer of a first conductivity type;
   a second semiconductor layer of a second conductivity type provided on the first semiconductor layer;
   a third semiconductor layer of the first conductivity type provided on the second semiconductor layer;
   a plurality of control electrodes provided respectively in a plurality of trenches, the plurality of trenches having depths into the first semiconductor layer from a top surface of the third semiconductor layer, the plurality of control electrodes having ends positioned in the first semiconductor layer;
   an insulating region provided between a first control electrode and a second control electrode of the plurality of control electrodes, the first control electrode and the second control electrode being adjacent to each other in a first direction along an interface between the first semiconductor layer and the second semiconductor layer, the insulating region extending in a second direction from the third semiconductor layer toward the first semiconductor layer, the insulating region having an end positioned in the first semiconductor layer, the end of the insulating region being positioned at a level in the second direction lower than the level in the second direction of the ends of the plurality of control electrodes;
a fourth semiconductor layer of the second conductivity type provided between the insulating region and the first semiconductor layer, between the insulating region and the first control electrode, and between the insulating region and the second control electrode;
a first insulating film provided between the first control electrode and the fourth semiconductor layer, the fourth semiconductor layer being in contact with a whole portion of the first insulating film positioned between the first control electrode and the fourth semiconductor layer;
a second insulating film provided between the second control electrode and the fourth semiconductor layer, the fourth semiconductor layer being in contact with a whole portion of the second insulating film positioned between the second control electrode and the fourth semiconductor layer; and
a first electrode connected to the third semiconductor layer and the fourth semiconductor layer.

2. The device according to claim 1, wherein the insulating region extends in the second direction and a third direction, the third direction being along the interface between the first semiconductor layer and the second semiconductor layer, the third direction crossing the second direction.

3. The device according to claim 1, further comprising a second electrode electrically connected to the first semiconductor layer,
the first semiconductor layer, the second semiconductor layer, and the third semiconductor layer being positioned between the first electrode and the second electrode,
a distance in the second direction from the second electrode to the insulating region being shorter than a distance in the second direction from the second electrode to one of the plurality of control electrodes.

4. The device according to claim 3, further comprising a fifth semiconductor layer of the first conductivity type provided between the first semiconductor layer and the second electrode, the fifth semiconductor layer including a first-conductivity-type impurity with a concentration higher than a concentration of a first-conductivity-type impurity in the first semiconductor layer.

5. The device according to claim 3, further comprising a fifth semiconductor layer of the second conductivity type provided between the first semiconductor layer and the second electrode.

6. The device according to claim 1, wherein the first semiconductor layer has no portions provided between the first insulating film and the fourth semiconductor layer, and between the second insulating film and the fourth semiconductor layer.

7. The device according to claim 1, further comprising:
a first contact region of the second conductivity type selectively provided between the first electrode and the second semiconductor layer, the first contact region including a second-conductivity-type impurity with a concentration higher than a concentration of a second-conductivity-type impurity in the second semiconductor layer; and
a second contact region of the second conductivity type selectively provided between the first electrode and the fourth semiconductor layer, the second contact region including a second-conductivity-type impurity with a concentration higher than a concentration of a second-conductivity-type impurity in the fourth semiconductor layer,
the first electrode contacting the first contact region and the second contact region.

8. The device according to claim 7, wherein the first electrode includes a portion extending through the third semiconductor layer in the second direction, and contacts the first contact region that contacts the second semiconductor layer.

9. The device according to claim 7, wherein
the second contact region contacts the fourth semiconductor layer, and
a boundary between the second contact region and the fourth semiconductor layer is positioned at a level in the second direction between a first level in the second direction and a second level in the second direction, the interface between the first semiconductor layer and the second semiconductor layer being positioned at the first level, an interface between the first electrode and the third semiconductor layer being positioned at the second level.

10. The device according to claim 1, wherein
the insulating region has a side surface crossing the first direction, and a bottom surface crossing the second direction, and
the fourth semiconductor layer continuously covers the side surface and the bottom surface of the insulating region.

11. The device according to claim 1, wherein the insulating region includes a dielectric.

12. The device according to claim 11, wherein the dielectric includes an impurity of the second conductivity type.

13. The device according to claim 1, wherein the insulating region includes a void.

14. The device according to claim 1, further comprising:
another insulating region adjacent to the insulating region, the first semiconductor region including a portion positioned between the insulating region and the another insulating region, wherein
an amount of a second-conductivity-type impurity and an amount of a first-conductivity-type impurity are balanced in the fourth semiconductor layer and the first semiconductor layer at a level in the second direction where the portion of the first semiconductor layer contacts the fourth semiconductor layer.

15. The device according to claim 1, further comprising a plurality of insulating regions including the insulating region and being arranged in the first direction,
the plurality of insulating regions further including another insulating region adjacent to the insulating region in the first direction, and
the plurality of control electrodes including three control electrodes arranged in the first direction between the insulating region and the another insulating region.

16. A semiconductor device, comprising:
a first semiconductor layer of a first conductivity type;
a second semiconductor layer of a second conductivity type provided on the first semiconductor layer;
a third semiconductor layer of the first conductivity type provided on the second semiconductor layer;
an insulating region extending in the first semiconductor layer from a top surface of the third semiconductor layer, the insulating region having a bottom end in the first semiconductor layer;
a control electrode provided in a trench between the third semiconductor layer and the insulating region, the trench surrounding the insulating region and having a depth into the first semiconductor layer from the top surface of the third semiconductor layer, the control electrode having a bottom end in the first semiconductor layer, the bottom end of the insulating region being positioned at a level deeper than a level of the bottom end of the control electrode;

a fourth semiconductor layer of the second conductivity type provided between the insulating region and the first semiconductor layer and between the insulating region and the control electrode;

an insulating film provided between the control electrode and the fourth semiconductor layer, the fourth semiconductor layer being in contact with a whole portion of the insulating film positioned between the control electrode and the fourth semiconductor layer; and a first electrode connected to the third semiconductor layer and the fourth semiconductor layer.

17. The device according to claim 16, comprising a plurality of insulating regions including the insulating region, the plurality of insulating regions being disposed to be separated from each other in a direction along the top surface of the third semiconductor layer.

18. The device according to claim 16, wherein the control electrode is provided in a lattice configuration when viewed from above.

19. The device according to claim 16, wherein the control electrode is electrically insulated from the first semiconductor layer, the second semiconductor layer, the third semiconductor layer, and the fourth semiconductor layer by the insulating film covering an inner surface of the trench.

20. The device according to claim 16, further comprising:

a first contact region of the second conductivity type selectively provided between the first electrode and the second semiconductor layer, the first contact region including a second-conductivity-type impurity with a concentration higher than a concentration of a second-conductivity-type impurity in the second semiconductor layer; and a second contact region of the second conductivity type selectively provided between the first electrode and the fourth semiconductor layer, the second contact region including a second-conductivity-type impurity with a concentration higher than a concentration of a second-conductivity-type impurity in the fourth semiconductor layer, the first electrode contacting the first contact region and the second contact region.

* * * * *